United States Patent
Tanaka

(10) Patent No.: US 8,183,877 B2
(45) Date of Patent: May 22, 2012

(54) MATERIAL FOR PROBE PINS

(75) Inventor: Kunihiro Tanaka, Isehara (JP)

(73) Assignee: Tanaka Kikinzoku Kogyo K.K., Tokyo (JP)

(*) Notice: Subject to any disclaimer, the term of this patent is extended or adjusted under 35 U.S.C. 154(b) by 848 days.

(21) Appl. No.: 11/237,544

(22) Filed: Sep. 28, 2005

(65) Prior Publication Data

US 2006/0197542 A1    Sep. 7, 2006

(30) Foreign Application Priority Data

Mar. 4, 2005    (JP) ............................... P2005-059926

(51) Int. Cl.
  *G01R 31/20*    (2006.01)
(52) U.S. Cl. ............... 324/754.03; 324/500; 324/754.01
(58) Field of Classification Search ................... None
  See application file for complete search history.

(56) References Cited

U.S. PATENT DOCUMENTS

| | | | | |
|---|---|---|---|---|
| 4,846,941 A | * | 7/1989 | Graham et al. ................ | 205/255 |
| 4,910,091 A | * | 3/1990 | Garg et al. .................... | 428/552 |
| 5,139,891 A | * | 8/1992 | Cowie et al. .................. | 428/670 |
| 5,280,236 A | * | 1/1994 | Takahashi et al. ............ | 324/754 |
| 5,502,994 A | * | 4/1996 | Katoh et al. ................... | 72/327 |
| 5,652,428 A | * | 7/1997 | Nishioka et al. ................. | 850/4 |
| 6,415,182 B1 | * | 7/2002 | Ibrahim ......................... | 607/36 |
| 6,642,731 B2 | * | 11/2003 | Masuda ........................ | 324/757 |
| 6,809,539 B2 | * | 10/2004 | Wada et al. ................... | 324/762 |
| 6,852,925 B2 | * | 2/2005 | Wolf et al. .................... | 174/50.6 |
| 7,071,406 B2 | * | 7/2006 | Smalley et al. ............... | 136/252 |
| 7,154,713 B2 | * | 12/2006 | Watanabe et al. ............. | 360/313 |
| 7,244,367 B2 | * | 7/2007 | Bernstein et al. ............... | 216/2 |
| 2002/0047721 A1 | * | 4/2002 | Mikami ........................ | 324/761 |
| 2006/0261827 A1 | * | 11/2006 | Cooper et al. ................. | 324/754 |
| 2008/0278053 A1 | * | 11/2008 | Kumagai et al. .............. | 313/141 |

FOREIGN PATENT DOCUMENTS

| | | |
|---|---|---|
| JP | 10-038922 | 2/1998 |
| JP | 11-094875 | 4/1999 |

* cited by examiner

*Primary Examiner* — Jermele M Hollington
*Assistant Examiner* — Trung Nguyen
(74) *Attorney, Agent, or Firm* — Roberts & Roberts, LLP

(57) ABSTRACT

Probe pins related to the present invention are formed from a material which consists essentially of one or more elements selected from the group consisting of platinum, iridium, ruthenium, osmium, palladium and rhodium. A material obtained by adding one or more elements selected from the group consisting of tungsten, nickel and cobalt to this metal may also be used.

2 Claims, No Drawings

(12)  United States Patent US 8,183,877 B2

MATERIAL FOR PROBE PINS

BACKGROUND OF THE INVENTION

1. Field of the Invention

The present invention relates to a material for probe pins to be incorporated in a probe card to inspect the electrical properties of an integrated circuit formed on a semiconductor wafer.

2. Description of the Related Art

A probe card in which multiple probe pins are arrayed is used in performing the inspection of the electrical properties of a semiconductor integrated circuit, a liquid crystal display device, and the like formed on a wafer. Usually, this inspection is performed by bringing the probe pins into contact with multiple electrode pads of a semiconductor integrated circuit, a liquid crystal display device, and the like formed on a wafer, which are objects of the inspection.

Such probe pins are required to have not only high electrical conductivity and corrosion resistance, but also properties such as high hardness and high spring characteristics. The reason why high hardness is required of probe pins is that it is necessary to have strength sufficient for withstanding repeated inspection, which is performed millions of times, and the reason why high spring characteristics are requited is that the contact between probe pins and electrode pads is stabilized and that the wear of the probe pins themselves is reduced.

On the other hand, owing to the recent large capacity design of memory devices and miniaturization of packages, the spacing of electrode pads of a semiconductor integrated circuit and the like has become increasingly narrow. Also in a probe card, to cope with the narrow pitch design of electrode pads, it has been required to narrow the pitch of probe pins and to make the wire diameter of probe pins small. To meet these demands, materials for probe pins having sufficient hardness and good workability are sought.

Conventionally used materials for probe pins are those containing tungsten (W) as described in Japanese Patent Application Laid-Open No. 10-038922, those using an alloy obtained by adding silver and the like to palladium (Pd) as described in the Japanese Patent Application Laid-Open No. 11-94875. These materials are used appropriately in accordance with the types of electrode pads of a semiconductor integrated circuit and a liquid display device, which are the objects of inspection. Aluminum pads and gold pads are mainly used as these electrode pads. In probe pins for aluminum pads, tungsten which is a high hardness metal is used so as to be able to break oxide films formed on the pad surfaces. In probe pins for gold pads, it is a general practice to use palladium alloys which have generally high hardness although they have lower hardness than tungsten, in order to prevent the pad surfaces from being damaged.

However, when tungsten is used in probe pins, the following problem arose because of the oxidation easiness of tungsten. That is, when probe pins come into contact with the electrode pads of an object of measurement, tungsten oxide films on the probe pin surfaces exfoliate and adhere to the electrode pads. Therefore, if a continuity test is carried out in this state, poor conduction occurs and accurate measured values cannot be obtained.

On the other hand, when palladium alloys are used in probe pins, sufficient hardness for probe pins is not obtained by usual wire drawing although palladium alloys have electrical conductivity and oxidation resistance necessary for probe pins. Therefore, materials must be fabricated by performing precipitation hardness in order to obtain sufficient hardness, posing a problem that the number of manufacturing steps increases.

The present invention has been made in view of the above circumstances and provides a material which has sufficient hardness for probe pins and is excellent in oxidation resistance and workability in addition to electrical conductivity and high spring characteristics.

SUMMARY OF THE INVENTION

To solve the above-described problems, the present inventors earnestly devoted themselves to research and as a result, they found that a material related to the present invention consists essentially of one or more elements selected from the group consisting of platinum, iridium, ruthenium, osmium, palladium and rhodium. These precious metals and their precious metal alloys are suitable for materials for probe pins because they have electrical conductivity, high spring characteristics and oxidation resistance as well as appropriate hardness.

"Appropriate hardness" means that a material has strength suitable for probe pins and hardness which facilitates working. Probe pins for aluminum pads and probe pins for gold pads are required to have different levels of hardness due to the difference in the material characteristics between aluminum and gold as the materials for pads. In general, materials of a little higher hardness are used in probe pins for aluminum pads than in probe pins for gold pads.

In probe pins for aluminum pads, the hardness is not less than 400 in Vickers hardness, preferably in the range of 400 to 600. This is because if Vickers hardness is less than 400, the strength is insufficient for probe pins and cannot withstand repeated inspection. On the other hand, if Vickers hardness exceeds 600, the material is excessively hard and the working of the material becomes difficult.

It is preferred that a material for probe pins related to the present invention consist essentially, by weight, of 5 to 30% rhodium and the balance iridium. The Vickers hardness of these materials is 400 to 600 and these materials have sufficient hardness for probe pins used in aluminum pads. Unlike conventional probe pins of tungsten, these materials have oxidation resistance and high spring characteristics. The reason why the concentration range of rhodium is limited to 5 to 3% by weight is that hardness decreases in concentrations less than 5% by weight and workability decreases in concentrations exceeding 30% by weight.

Furthermore, it is also possible to adopt a material obtained by adding one or more elements selected from the group consisting of nickel, tungsten and cobalt to a precious metal or a precious metal alloy formed from one or more elements selected from the group consisting of platinum, iridium, ruthenium, osmium, palladium and rhodium. The addition of nickel, tungsten and cobalt to the above-described precious metal or precious metal alloy is effective in increasing hardness. Incidentally, these materials are suitable as materials for probe pins for gold pads.

It is preferred that the Vickers hardness of probe pins for gold pads be not less than 300, preferably in the range of 300 to 500. This is because if the Vickers hardness is less than 300, the strength is insufficient for probe pins and does not withstand repeated inspection. This is also because if the Vickers hardness exceeds 500, during contact between probe pins and gold pads, the gold pads may be damaged.

Furthermore, it is preferred that a material for probe pins related to the present invention consist essentially, by weight, of 5 to 40% iridium and the balance platinum. The Vickers hardness of these materials is 300 to 500 and these materials have hardness sufficient for probe pins used in gold pads. Unlike conventional probe pins of palladium alloy, these materials have high spring characteristics. The reason why the concentration range of iridium is limited to 5 to 40% is that hardness decreases in concentrations of less than 5% by weight and workability and oxidation resistance deteriorate in concentrations exceeding 50% by weight.

As a material for probe pins, it is also possible to adopt a platinum alloy which consists essentially of one element selected from, by weight, 5 to 30% nickel, 5 to 10% tungsten, 10 to 30% cobalt and the balance platinum. The Vickers hardness of these materials is 300 to 500 and these materials have sufficient hardness for probe pins for gold pads. Unlike probe pins of palladium alloy, these materials have high spring characteristics. The reason why the concentration range of nickel is limited to 5 to 30% by weight is that hardness decreases in concentrations of less than 5% by weight and electrical conductivity worsens in concentrations exceeding 30% by weight. And the reason why the concentration range of tungsten is limited to 5 to 10% by weight is that hardness decreases in concentrations of less than 5% by weight and workability, oxidation resistance and electrical conductivity deteriorate in concentrations exceeding 30% by weight. Furthermore, the reason why the concentration range of cobalt is limited to 10 to 30% by weight is that hardness decreases in concentrations of less than 10% by weight and workability, oxidation resistance and electrical conductivity deteriorate in concentrations exceeding 30% by weight.

A probe card of the present invention is provided with probe pins formed from the above-described materials. Probe pins formed from these materials have sufficient hardness and are excellent in oxidation resistance and workability in addition to electrical conductivity and high spring characteristics. For this reason, it can be said that the above-described probe card can sufficiently cope with the recently required narrow pitch design of probe pins.

Materials for probe pins in the present invention have hardness sufficient for probe pins in addition to high spring characteristics and electrical conductivity and are excellent in oxidation resistance and workability. That is, according to the present invention, it is possible to manufacture a prove pin having a material that can address a shift to a narrow pitch required in recent years.

DETAILED DESCRIPTION OF THE PREFERRED EMBODIMENTS

Preferred examples of the present invention, along with comparative examples, will be described below.

Example 1 to Example 5

In these examples, wires were fabricated from iridium-rhodium alloys, which are considered to be preferred materials for use in probe pins for aluminum pads. Iridium and rhodium, which are raw materials, were subjected to preliminary melting, and then were melted in an argon atmosphere through arc melting and ingots were made through forming. The ingots were rolled with the use of grooved rolls or worked by hot wire drawing, whereby plate materials or wire rods having a circular section were formed. After that, by performing rolling with the use of grooved rolls and wire drawing, wires having an outside diameter of 0.1 mm were fabricated. The chemical compositions of the produced iridium-rhodium alloys are shown in Table 1.

TABLE 1

|           | Ir (wt %) | Rh (wt %) |
|-----------|-----------|-----------|
| Example 1 | 100       | 0         |
| Example 2 | 90        | 10        |
| Example 3 | 80        | 20        |
| Example 4 | 60        | 40        |
| Example 5 | 0         | 100       |

Comparative Example 1

Wires of 100% tungsten by weight were fabricated as a comparative example for Examples 1 to 5. The tungsten wires was made to have an outside diameter of 0.1 mm.

Next, in Examples 6 to 17, wires of platinum alloys were fabricated from platinum alloys, which are considered to be preferred materials for use in probe pins for gold pads. A concrete description is given below.

Example 6 to Example 8

In these examples, wires of platinum-tungsten alloys were fabricated. The raw material was subjected to preliminary melting, and then was melted in an argon atmosphere through high-frequency melting and ingots were made through forming. The ingots were rolled with the use of grooved rolls or worked by hot wire drawing, whereby plate materials or wire rods having a circular section were formed. After that, by performing rolling with the use of grooved rolls and wire drawing, wires having an outside diameter of 0.1 mm were fabricated. The chemical compositions of the produced alloys are shown in Examples 6 to 8 of Table 2.

Example 9 to Example 11

In these examples, wires of platinum-nickel alloys with an outside diameter of 0.1 mm were fabricated. The method of manufacturing the wires, which is the same as in the case of the wires of platinum-tungsten alloys of Examples 6 to 8, is omitted. The chemical compositions of the produced alloys are shown in Examples 9 to 11 of Table 2.

Example 12 to Example 14

In these examples, wires of platinum-iridium alloys with an outside diameter of 0.1 mm were fabricated. The method of manufacturing the wires, which is the same as in the case of the wires of platinum-tungsten alloys of Examples 6 to 8, is omitted. The chemical compositions of the produced alloys are shown in Examples 12 to 14 of Table 2.

Example 15 to Example 17

In these examples, wires of platinum-cobalt alloys with an outside diameter of 0.1 mm were fabricated. The method of manufacturing the wires, which is the same as in the case of the wires of platinum-tungsten alloys of Examples 6 to 8, is omitted. The chemical compositions of the produced alloys are shown in Examples 15 to 17 of Table 2.

TABLE 2

|           | Pt (wt %) | W (wt %) | Ni (wt %) | Ir (wt %) | Co (wt %) |
|-----------|-----------|----------|-----------|-----------|-----------|
| Example 6 | 95        | 5        | —         | —         | —         |
| Example 7 | 92        | 8        | —         | —         | —         |

TABLE 2-continued

|  | Pt (wt %) | W (wt %) | Ni (wt %) | Ir (wt %) | Co (wt %) |
|---|---|---|---|---|---|
| Example 8 | 88 | 12 | — | — | — |
| Example 9 | 93 | — | 7 | — | — |
| Example 10 | 90 | — | 10 | — | — |
| Example 11 | 80 | — | 20 | — | — |
| Example 12 | 90 | — | — | 10 | — |
| Example 13 | 80 | — | — | 20 | — |
| Example 14 | 70 | — | — | 30 | — |
| Example 15 | 95 | — | — | — | 5 |
| Example 16 | 90 | — | — | — | 10 |
| Example 17 | 76.7 | — | — | — | 23.3 |

Comparative Example 2

Wires of palladium alloy with an outside diameter of 0.1 mm were fabricated as a comparative example for Examples 6 to 17. The method of manufacturing the wires, which is the same as in the case of the wires of platinum-tungsten alloys of Examples 6 to 8, is omitted. The chemical composition of the produced alloy is shown in Table 3.

TABLE 3

|  | Pd (wt %) | Ag (wt %) | Au (wt %) | Pt (wt %) | Others |
|---|---|---|---|---|---|
| Comparative Example 2 | 35 | 30 | 10 | 10 | Cu, Zn |

Method of Evaluating Each Wire

Whether the wires of the examples are suitable for materials for probe pins was examined through comparison in terms of hardness, spring characteristics, electrical conductivity and oxidation resistance.

For hardness, Vickers hardness was measured in the wires of the examples and comparative examples with the use of a Vickers hardness meter.

An evaluation of spring characteristics was performed by using measured values of elastic modulus and an evaluation of electrical conductivity was performed by using measured values of electric resistance.

A tension test was conducted in the wires of the examples and comparative examples, and an elastic modulus was calculated on the basis of the result.

For an electric resistance value, a resistance value for a unit length (1 m) was measured with the use of an electric resistor in the wires (φ 0.1 mm) of the examples and comparative examples.

For an oxidation resistance, the wires of the examples and comparative examples were heated to 800° C. and whether the wires discolor after the heating was visually inspected. The evaluation of oxidation resistance was performed by a five-stage evaluation in which intense discoloration (low oxidation resistance) is graded 1 and a case where discoloration scarcely occurs (high oxidation resistance) is graded 5, and it was assumed that the higher the value, the better the oxidation resistance.

Results of Evaluation of Each Wire

First, Table 4 shows the results of the above tests conducted in the wires of iridium, rhodium and iridium-rhodium alloys of Example 1 to Example 5 and the tungsten wire of Comparative Example 1.

TABLE 4

|  | Hardness (HV) | Elastic modulus (GPa) | Electric resistance (Ω) | Oxidation resistance |
|---|---|---|---|---|
| Example 1 | 500 | 570 | 4.9 | 2 |
| Example 2 | 500 | 480 | 9.35 | 3 |
| Example 3 | 450 | 450 | 12 | 4 |
| Example 4 | 400 | 420 | 18 | 4 |
| Example 5 | 500 | 380 | 4.7 | 4 |
| Comparative Example 1 | 700 | 400 | 5.5 | 1 |

In the wires of rhodium, iridium-rhodium alloys and iridium of Example 1 to Example 5, the hardness was from 400 HV to 500 HV regardless of the chemical composition of the material. Compared to the wire of Comparative Example, the wires of Example 1 to Example 5 were excellent in oxidation resistance, considerably good in the elastic modulus and equivalent in electric resistance value.

From the above results, it was ascertained that the wires of rhodium, iridium-rhodium alloys and iridium of Example 1 to Example 5 have good quality in the balance of all of hardness, spring characteristics, electrical conductivity and oxidation resistance and are suitable materials for use in probe pins for aluminum pads.

Next, Table 5 shows the results of the above tests conducted in the wires of platinum-tungsten alloys of Examples 6 to 8, platinum-nickel alloys of Examples 9 to 11, platinum-iridium alloys of Examples 12 to 14, platinum-cobalt alloys of Examples 15 to 17, and palladium alloy of Comparative Example 2.

TABLE 5

|  | Hardness (HV) | Elastic modulus (GPa) | Electric resistance (Ω) | Oxidation resistance |
|---|---|---|---|---|
| Example 6 | 360 | 240 | 58.0 | 4 |
| Example 7 | 380 | 240 | 62.5 | 4 |
| Example 8 | 420 | 250 | 73.5 | 3 |
| Example 9 | 300 | 130 | 21.7 | 5 |
| Example 10 | 350 | 150 | 27.0 | 5 |
| Example 11 | 480 | 170 | 34.1 | 5 |
| Example 12 | 300 | 220 | 28.2 | 5 |
| Example 13 | 320 | 230 | 30.2 | 4 |
| Example 14 | 360 | 260 | 35.0 | 4 |
| Example 15 | 400 | 135 | 50.0 | 4 |
| Example 16 | 420 | 140 | 50.8 | 3 |
| Example 17 | 450 | 170 | 56.7 | 2 |
| Comparative Example 2 | 300 | 100 | 31.6 | 3 |

The platinum-tungsten alloys of Examples 6 to 8 all had hardness of 300 HV to 500 HV and showed a tendency for hardness to increase with increasing added amount of tungsten. The wires of Examples 6 to 8 were excellent in oxidation resistance and also had good elastic modulus values although they showed a little higher electric resistance values than the wire of Comparative Example 2.

The platinum-nickel alloys of Examples 9 to 11 all had hardness of 300 HV to 500 HV and showed a tendency for hardness to increase with increasing added amount of nickel. Compared to the wire of Comparative Example 2, the wires of Examples 9 to 11 were excellent in oxidation resistance, had large elastic modulus values and showed almost the same electric resistance values.

The platinum-iridium alloys of Examples 12 to 14 all had hardness of 300 HV to 400 HV and showed a tendency for hardness to increase with increasing added amount of iridium. Compared to the wire of Comparative Example 2, the wires of Examples 12 to 14 were excellent in oxidation resistance, had large elastic modulus values and besides showed small electric resistance values.

The platinum-cobalt alloys of Examples 15 to 17 all had hardness of 400 HV to 500 HV and showed a tendency for hardness to increase with increasing added amount of cobalt. The wires of Examples 15 to 17 had large elastic modulus values and were good although they were somewhat inferior in oxidation resistance and had a little larger electric resistance values than the wire of Comparative Example 2.

From the above results, it was ascertained that the platinum alloys shown in Examples 6 to 17 are good in the balance of hardness, spring characteristics, electrical conductivity and oxidation resistance and suitable materials for use in probe pins for gold pads.

What is claimed is:

1. A probe pin formed from an alloy, said alloy consisting essentially of 20 to 30% by weight of nickel, and the balance platinum; which probe pin has a Vickers hardness of not less than 300 and not more than 600.

2. A probe card comprising probe pins according to claim 1.

* * * * *